(12) United States Patent
Diep (10) Patent No.: US 8,393,526 B2
(45) Date of Patent: Mar. 12, 2013

(54) SYSTEM AND METHOD FOR PACKAGING ELECTRONIC DEVICES

(75) Inventor: Buu Diep, Murphy, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/273,881

(22) Filed: Oct. 14, 2011

(65) Prior Publication Data

US 2012/0097734 A1    Apr. 26, 2012

Related U.S. Application Data

(60) Provisional application No. 61/405,561, filed on Oct. 21, 2010.

(51) Int. Cl.
*B23K 31/02* (2006.01)
(52) U.S. Cl. ............. 228/180.1; 228/180.22; 228/124.6
(58) Field of Classification Search ............... 228/180.1, 228/180.22, 124.6
See application file for complete search history.

(56) References Cited

U.S. PATENT DOCUMENTS

| | | | |
|---|---|---|---|
| 5,193,734 | A | 3/1993 | Takayama et al. |
| 5,598,196 | A | 1/1997 | Braun |
| 6,814,778 | B1 | 11/2004 | Farnworth |
| 7,032,803 | B2 | 4/2006 | Matsuura et al. |
| 7,159,752 | B2 | 1/2007 | Farnworth |
| 7,396,701 | B2 | 7/2008 | Shigemura et al. |
| 7,490,403 | B2 | 2/2009 | Tanabe et al. |
| 8,011,562 | B2 | 9/2011 | Ishikawa et al. |
| 2002/0036223 | A1 | 3/2002 | Saito |
| 2005/0072828 | A1 | 4/2005 | Matsuura et al. |
| 2007/0134434 | A1 | 6/2007 | Yokoyama et al. |
| 2011/0183474 | A1 | 7/2011 | Shigemura et al. |

FOREIGN PATENT DOCUMENTS

EP    2 043 146    4/2009

OTHER PUBLICATIONS

Zakel et al., "Laser Solder Jetting in Advanced Packaging," 14th European Microelectrics and Packaging Conference & Exhibition, Germany, Jun. 23-25, 2003.
Complete Systems, Jetlab®, http://www.microfab.com/inex.php?option+com_contents&view=category&layout=blog&id=9&Itemid=7, downloaded Oct. 10, 2011.
Laser Solder Jetting Systems $SB^2$-Jet, Pac Tech, Packaging Technologies, http://pactech.com/files/PAC%20tech_sb2-Jet%20SB2-SM%20SB2-M.pdf, downloaded Oct. 10, 2011.
Invitation to Pay Additional Fees and, Where Applicable, Protest Fee, PCT/US2011/056618, date of mailing Apr. 12, 2012, 5 pgs.
Hata, Hisatoshi et al., "Uncooled IRFPA with Chip Scale Vacuum Package", Proc. Of SPIE vol. 6206, 2006, pp. 620619-1 to 620619-10.
Fukumoto, Hiroshi et al., "Variable Droplet Size Molten Solder Ejection Tool for Microelectronics Packaging", 2006 Society for Imaging Science and Technology, Digital Fabrication 2006, Final Program and Proceedings, Sep. 17-22, 2006, 5 pgs.
PCT International Search Report and Written Opinion of the ISA dated Jul. 3, 2012; for PCT Pat. App. No. PCT/US2011/056618; 17 pages.

*Primary Examiner* — Nicholas P D'Aniello
(74) *Attorney, Agent, or Firm* — Daly, Crowley, Mofford & Durkee, LLP (57) ABSTRACT

In accordance with particular embodiments, a method for packaging electronic devices includes melting solder for a solder jet. The method additionally includes depositing the melted solder from the solder jet in a pattern on a first substrate of a first component of an electronic device. The pattern comprises a plurality of individual dots of melted solder. The method also includes aligning a second substrate of a second component of the electronic device with the pattern deposited on the first substrate of the electronic device. The method further includes re-melting the solder deposited in the pattern on the first substrate. The method additionally includes, while the solder is re-melting, compressing the first and second substrates.

6 Claims, 3 Drawing Sheets

SYSTEM AND METHOD FOR PACKAGING ELECTRONIC DEVICES

CROSS-REFERENCE TO RELATED APPLICATIONS

This application claims the benefit of priority under 35 U.S.C. §119(e) of U.S. Provisional Application Ser. No. 61/405,561 filed Oct. 21, 2010.

BACKGROUND

Traditionally, techniques such as physical vapor deposition (PVD) of gold tin solder (e.g., sputtering or evaporation), plating, or attaching preforms were used to seal wafer level packaged electronic devices using solder. If one of the various PVD methods are used, the process may include extra processing steps (e.g., lithography for wet etch or lift-off) and the waste of expensive materials (e.g., the bulk of the deposited metals may be removed). The PVD methods also do not, as a practical matter, allow for very tall bond lines (typically less than 3 micrometers high). If plating is used to bond two components, it may not be possible to have a high vacuum inside the sealed device because plated metals are porous and have high outgassing characteristics. If preforms are used, they may be manually aligned and attached, resulting in extensive touch labor which can be expensive and inaccurate. Preforms may also be limited in size. Additionally, commercial wafer bonders for wafer level packaging may employ spacers in the order of 100 um-200 um to maintain a gap between the two substrates before actual bonding. This small gap may inhibit creating a high vacuum inside the sealed device due to a low vacuum conductance.

One common problem with many of the above methods is the high risk of blow-outs. Blow-outs may occur when the small change in cavity volume during the bonding process causes a large change in cavity pressure differential. This pressure differential may then attempt to escape by blowing out the melted solder. The blow-out could damage the seal and potentially short the electronic device being sealed.

SUMMARY OF THE DISCLOSURE

In accordance with particular embodiments, a method for packaging electronic devices includes melting solder for a solder jet. The method additionally includes depositing the melted solder from the solder jet in a pattern on a first substrate of a first component of an electronic device. The pattern comprises a plurality of individual dots of melted solder. The method also includes aligning a second substrate of a second component of the electronic device with the pattern deposited on the first substrate of the electronic device. The method further includes re-melting the solder deposited in the pattern on the first substrate. The method additionally includes, while the solder is re-melting, compressing the first and second substrates.

Certain embodiments may provide one or more technical advantages. For example, a technical advantage of one embodiment may be that an electronic device can be hermetically sealed with a reduced risk of blow-outs. Another technical advantage of certain embodiments may be that the hermetic seal may be made without requiring masking materials, lithography or other processing steps to remove excess solder. This may decrease the manufacturing costs (both in materials and in time) associated with manufacturing the electronic device. Other technical advantages will be readily apparent to one skilled in the art from the following figures, descriptions and claims. Moreover, while specific advantages have been enumerated above, various embodiments may include all, some, or none of the enumerated advantages.

BRIEF DESCRIPTION OF THE DRAWINGS

For a more complete understanding of particular embodiments and their advantages, reference is now made to the following description, taken in conjunction with the accompanying drawings, in which.

DETAILED DESCRIPTION OF THE DRAWINGS

Figure 1:
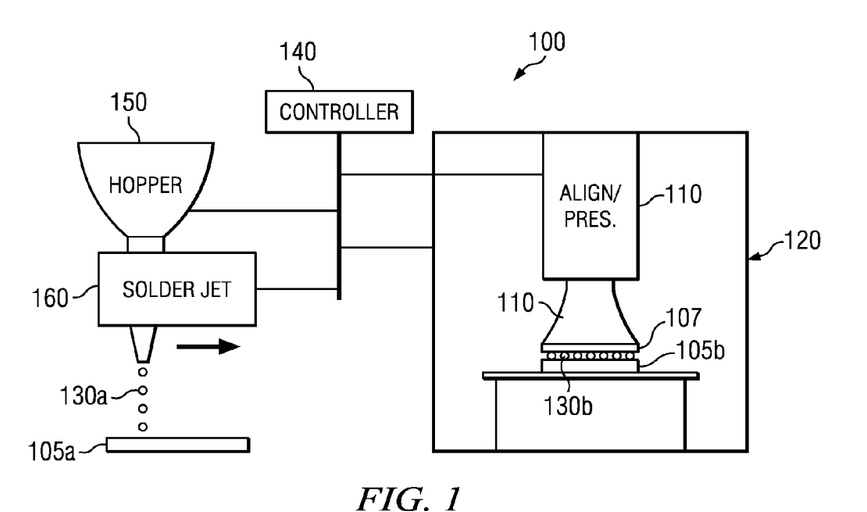
FIG. 1 depicts a block diagram of a system configured for wafer level packaging of electronic devices, in accordance with particular embodiments.

FIG. 1 depicts a block diagram of a system configured for wafer level packaging of electronic devices, in accordance with particular embodiments. In some embodiments, the components of system 100 may provide hermetic and high vacuum Wafer Level Packaging (WLP) of electronic devices using jetted solder. System 100 may use jetted solder for deposition of solder for high vacuum and hermetic sealing of wafer level packaged devices including, but not limited to, micro-electro-mechanical systems (MEMS) devices, wafer level packaged IR detectors and/or microbolometers. In some embodiments, jetting solder may be extremely flexible to design changes because the pattern of solder deposited by solder jet 160 may be controlled via a software template. Modification of the template may be all that is needed if new designs are introduced. Therefore changes to the jetted pattern due to device changes can be quickly implemented via change in the template.

In the depicted embodiment, system 100 includes various components used in creating a hermetic seal for wafer level packaging of electronic devices. The system allows the hermetic seal to be formed within a high vacuum state. System 100 may be able to package electronic devices with high vacuum hermetic seals without the use of lithography or other steps to remove excess metals and materials used in typical packaging techniques such as sputtering, evaporation, and plating. System 100 may create the hermetic seals using a pattern of jetted solder dots deposited on one or more components of the electronic device. The dot pattern may provide small gaps that allow for changes in pressure as the components are compressed together. The spacing between solder dots may be based on the size of the solder dots and/or the pattern (e.g., the final geometry of the pattern). As the solder dots melt and spread out, the gaps may begin to shrink and a hermetic seal is formed.

Hopper 150 may comprise any container, reservoir, hopper, or other device configured to hold solder, either melted or solid, for use by solder jet 160. The solder held in hopper 150 may include gold-tin solder (e.g., Au80-Sn20), tin-lead solder, tin-silver solder, tin-silver-copper solder, or any other type of solder that may be used with metal bonding (e.g., eutectic bonding). In some embodiments, the solder received by hopper 150 may already be melted when it is received by hopper 150. In such embodiments, hopper 150 may include a heating element to keep the melted solder in the melted state. In some embodiments, the solder received by hopper 150 may be in a solid state when it is received by hopper 150. In such embodiments, prior to the solder being deposited on substrate 105*a*, the solder may be melted by hopper 150, solder jet 160, or some component between hopper 150 and solder jet 160. Depending on operational needs or parameters, the amount of solder in hopper 150 may vary. For example, in some situations, hopper 150 may store enough solder for packaging a single electronic device, a single pair of substrates with a plurality of electronic devices thereon, packaging a run of electronic devices, or several runs of electronic devices (e.g., bulk supply of solder).

Solder from hopper 150 may be used by solder jet 160 to deposit individual melted solder drops 130*a* on substrate 105*a*. In some embodiments in which hopper 150 contains unmelted solder, solder jet 160 may melt the solder before it deposits the solder on substrate 105*a*. The individual melted solder dots 130*a* jetted from solder jet 160 may be deposited in a controlled fashion on substrate 105*a* in accordance with a particular pattern. Melted solder dots 130*a* may be deposited as individual drops with gaps between at least some of the individual drops. The gaps may allow for changes in pressure, or volume, to escape through the pattern as a second substrate is compressed over the pattern deposited by solder jet 160 on substrate 105*a*.

The pattern with which solder jet 160 deposits melted solder drops 130*a* may depend on any of a variety of different characteristics of the electronic device being packaged. In some embodiments, the pattern may be based on a pattern template received by the solder jet 160 from a controller, such as controller 140. As another example, in some embodiments, solder jet 160 may be able to recognize and follow a pattern present on substrate 105*a*. The pattern on substrate 105*a* may be used as a base metal to which the solder may adhere to when melted. Any suitable base metal may be used, such as a stack of metals comprising Ti/Pt/Au or Ti/NiV/Au.

In some embodiments, the base metal may be present on substrate 105*a* regardless of whether solder jet 160 relies on a template or the pattern to determine where to deposit melted solder dots 130*a*.

Once melted solder dots 130*a* have been deposited onto substrate 105*a*, a second substrate having a second component of the electronic device may be aligned with the pattern deposited on substrate 105*a* by alignment device 110. Substrate 105*b* may be a substrate, similar to substrate 105*a*, in which melted solder dots, similar to melted solder dots 130*a*, have cooled. Substrate 105*b* and substrate 107 are aligned and placed inside of a vacuum chamber 120. Vacuum chamber 120 may be able to create a vacuum and to increase the ambient temperature above the melting point of cooled solder dots 130*b*. The vacuum created by vacuum chamber 120 may create a vacuum within the gap between component 107 and component 105*b*. The spaces between cooled solder dots 130*b* may allow for the pressure difference between vacuum chamber 120 and the gap between components 107 and 105*b* to balance out or normalize. Heat created by vacuum chamber 120 may be sufficient to melt cooled solder dots 130*b*.

In addition to aligning substrates 105*b* and 107, alignment device 110 may be configured to apply pressure to compress substrates 107 and 105*b*. The pressure provided by alignment device 110 may be used to compress the volume of the gap between substrates 107 and 105*b*. In some embodiments, the compressive force may be gravity pulling on the upper substrate (e.g., component 107). Regardless of the source of the compressive force, as cooled solder dots 130*b* begin to melt from the increased temperature of vacuum chamber 120, the pressure may cause the now melting solder to spread out. As the compressive force compresses the gap between components 107 and 105*b*, any change in pressure due to the change in the volume of the gap may escape through the gaps between solder dots 130*b*. Eventually, solder dots 130*b* will form into a single continuous band that spreads out along the base pattern formed on the components. The melted solder may form a hermetic seal between components 107 and 105*b*. In some embodiments, the formation of the hermetic seal may be delayed until the end of the bonding process. This may allows the rise in pressure of the internal cavity to be vented prior to the final sealing moment to prevent blow-outs of the solder. Because the hermetic seal was formed while the components were in a state of vacuum, the gap between the components may similarly be in a vacuum. This may allow the corresponding electronic device to be hermetically sealed in a high vacuum wafer level packaged device.

Controller 140 may be any type of computer or control system that may comprise any combination of hardware components with software and/or logic encoded in a non-transitory computer readable medium for execution by a processor. Controller 140 may be configured to control any of the components of system 100. For example, controller 140 may control solder jet 160 and the depositing of melted solder dots 130*a* on substrate 105*a*. As another example, controller 140 may control alignment device 110 and the alignment of components 107 and 105*b*. As another example, controller 140 may control the vacuum and temperature of vacuum chamber 120. In certain embodiments, controller 140 may allow a user to simply and easily change the pattern with which solder is deposited on a component device. For example, controller 140 may allow a user to simply load a new pattern template. Depending on the embodiment, controller 140 may be a single controller responsible for all the components of system 100; multiple independent controllers for different components of system 100; or multiple controllers operating under one or more master controllers.

Figure 2A:
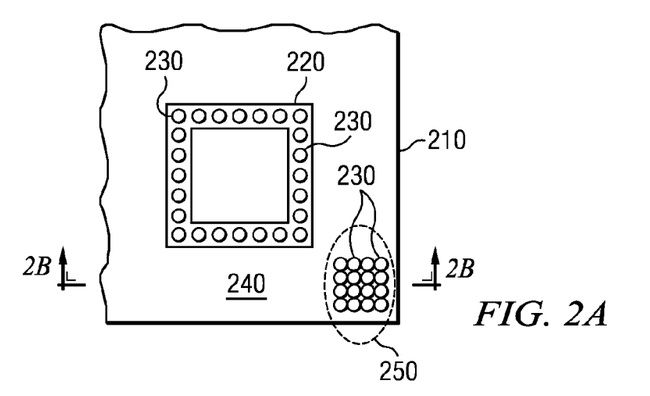
FIG. 2A depicts an overhead view of a component of an electronic device, in accordance with particular embodiments.

FIG. 2A is an overhead view of a component of an electronic device, in accordance with particular embodiments. In the depicted embodiment, component 210 includes pattern 220 and solder dots 230. Pattern 220 may be a metal base pattern formed on substrate 240. Substrate 240, (only a portion of which is depicted in FIGS. 2A-2D), may include multiple similar metal bases patterns. Each similar pattern may correspond to a separate electronic device. Pattern 220 may provide a material with which solder 230 is able to bond when melted. Pattern 220 may also provide a path over which solder dots 230 may reflow when the solder is reheated.

Column 250 may comprise a stack of solder dots 230. Column 250 may be formed by stacking solder dots 230 one atop the other until column 250 is of a desired height. In some embodiments, column 250 may be higher than solder dots 230 deposited around pattern 220. In such an embodiment, column 250 may be one of multiple columns spread out over other portions of the substrate. The columns may form support structures that may create a larger gap between the two components of the two substrates that are to be sealed together. This may help in normalizing the pressure as the two components are being sealed in a vacuum. In some embodiments, solder dots 230 may be stacked in a predetermined pattern so that column 250 may provide the desired pre-bond gap (e.g., in excess of 300 um). In some embodiments, during the bonding process, the two substrates may be held apart due to the height of column 250. The resulting gap may be maintained throughout the bake-out and vacuum cycle. In some embodiments, during the final sealing stage, column 250 may melt along with the sealing solder allowing the substrates to come to contact and bond.

Solder dots 230 may comprise fluxless solder that has been deposited on pattern 220 by a solder jet, such as solder jet 160 described above with respect to FIG. 1. When solder dots 230 are reheated and the solder is melted and reflows around pattern 220, the remelted solder may form a continuous solid bond line that may seal the device within pattern 220. The gaps between the individual solder dots 230, prior to fully melting, may provide passageways through which the pressure within pattern 220 and outside pattern 220 may normalize as a second component of the electronic device is aligned with the pattern 220 and the two are compressed together.

Figure 2B:
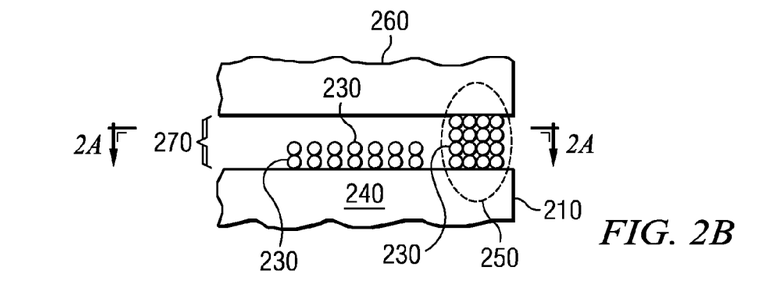
FIG. 2B depicts a profile view of two components of an electronic device, in accordance with particular embodiments.

FIG. 2B is a profile view of two components of an electronic device, in accordance with particular embodiments. In FIG. 2B, component 260 is aligned with pattern 220 (depicted in FIG. 2A) of component 210. Column 250 keeps component 260 elevated above component 210 until solder dots 230 melt. The extra height created by solder dots 230 of column 250 may create vacuum conductance gap 270 between components 210 and 260. In some embodiments, vacuum conductance gap 270 may be in excess of 300 micrometers. Vacuum conductance gap 270 may facilitate in normalizing the pressure differential between components 210 and 260 and the surrounding environment within a vacuum chamber. The extra height may be formed by depositing additional solder dots 230 on top of previously deposited solder dots 230. When solder dots 230 are melted, vacuum conductance gap 270 may decrease as the pressure compresses components 210 and 260 together.

Figure 2C:
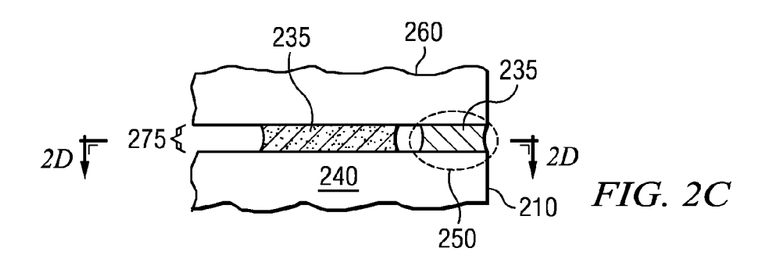
FIG. 2C depicts a profile view of two components of an electronic device in which the solder has melted, in accordance with particular embodiments.

FIG. 2C is a profile view of two components of an electronic device in which the solder has melted, in accordance with particular embodiments. FIG. 2C may depict a portion of two substrates comprising the two components of an electronic device after solder 230 (FIGS. 2A and 2B) has melted. Melted solder 235 may reflow to form a hermetic seal between components 210 and 260. Because the solder has melted and spread out, there may no longer be gaps between individual solder dots. Gap 275 between components 210 and 260 may also have shrunk from conductance gap 270 shown in FIG. 2B.

Figure 2D:
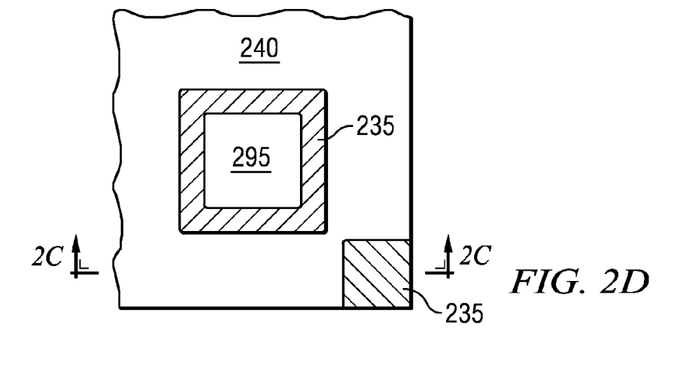
FIG. 2D depicts an overhead view of a component of an electronic device in which the solder has melted, in accordance with particular embodiments.

FIG. 2D is an overhead view of a component of an electronic device in which the solder has melted, in accordance with particular embodiments. Volume 295 may be a vacuumed volume that is hermetically sealed by melted solder 235. In some embodiments, substrate 240 may include several vacuumed volumes similar to volume 295. Each of these volumes may correspond to a different electronic device. For example, each volume 295 may include a microchip, a micro-electro-mechanical (MEM) device, an IR detector or any other electronic component for which it is desirable to be hermetically sealed and/or hermetically sealed within a vacuum.

Figure 3:
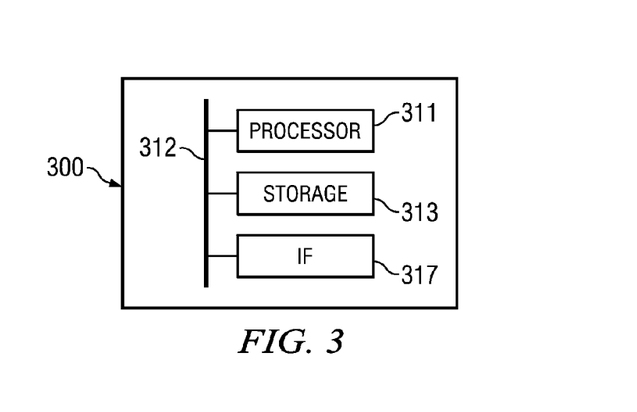
FIG. 3 depicts a detailed block diagram of the components of a controller used to manage the wafer level packaging of an electronic device, in accordance with particular embodiments.

FIG. 3 depicts a detailed block diagram of the components of a controller used to manage the packaging of an electronic device, in accordance with particular embodiments. Controller 300 may be used to manage one or more devices used in the wafer level packaging of electronic devices. The components that may be controlled or managed by controller 300 include, but are not limited to, one or more hoppers (e.g., hopper 150 depicted in FIG. 1), one or more hopper feeders (e.g., supply solder to the hopper), one or more solder jets (e.g., solder jet 160 depicted in FIG. 1), one or more alignment devices (e.g., alignment device 110 depicted in FIG. 1), one or more vacuum chambers (e.g., vacuum chamber 120 depicted in FIG. 1), one or more other controllers (e.g., controller 140 depicted in FIG. 1), and/or any other components or devices that may be used in packaging an electronic device.

Controller 300 may include one or more portions of one or more computer systems. In particular embodiments, one or more of these computer systems may perform one or more steps of one or more methods described or illustrated herein. In particular embodiments, one or more computer systems may provide functionality described or illustrated herein. In particular embodiments, software stored in a non-transitory medium and running on one or more computer systems may perform one or more steps of one or more methods described or illustrated herein or provide functionality described or illustrated herein.

The components of controller 300 may comprise any suitable physical form, configuration, number, type and/or layout. As an example, and not by way of limitation, controller 300 may comprise an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, controller 300 may include one or more computer systems; be unitary or distributed; span multiple locations; span multiple machines; or reside in a cloud, which may include one or more cloud components in one or more networks.

Where appropriate, one or more components of controller 300 may perform without substantial spatial or temporal limitation one or more steps of one or more methods described or illustrated herein. As an example, and not by way of limitation, controller 300 may perform in real time or in batch mode one or more steps of one or more methods described or illustrated herein. One or more controllers may perform at different times or at different locations one or more steps of one or more methods described or illustrated herein, where appropriate.

In the depicted embodiment, controller 300 includes processor 311, storage 313, interface 317, and bus 312. These components may work together in general to manage the wafer level packaging of electronic devices in which a hermetic seal is formed using jetted solder. Although a particular controller 300 is depicted having a particular number of particular components in a particular arrangement, this disclosure contemplates any suitable controller 300 having any suitable number of any suitable components in any suitable arrangement.

Processor 311 may be a microprocessor, controller, application specific integrated circuit (ASIC), field-programmable gate array (FPGA), or any other suitable computing device, resource, or combination of hardware with encoded software and/or embedded logic operable to provide, either alone or in conjunction with other components, (e.g., storage 313) controller functionality. Such functionality may include directing a solder jet to deposit a pattern of melted solder dots onto a substrate of a component of an electronic device. Another example of controller functionality may include aligning two components of an electronic device such that the solder dots deposited, when re-melted, form a hermitic seal between the two components. Additional examples and functionality provided, at least in part, by processor 311 will be discussed below.

In particular embodiments, processor 311 may include hardware for executing instructions, such as those making up a computer program. As an example and not by way of limitation, to execute instructions, processor 311 may retrieve (or fetch) instructions from an internal register, an internal cache, or storage 313; decode and execute them; and then write one or more results to an internal register, an internal cache, or storage 313.

In particular embodiments, processor 311 may include one or more internal caches for data, instructions, or addresses. This disclosure contemplates processor 311 including any suitable number of any suitable internal caches, where appropriate. As an example and not by way of limitation, processor 311 may include one or more instruction caches, one or more data caches, and one or more translation lookaside buffers (TLBs). Instructions in the instruction caches may be copies of instructions in storage 313 and the instruction caches may speed up retrieval of those instructions by processor 311. Data in the data caches may be copies of data in storage 313 for instructions executing at processor 311 to operate on; the results of previous instructions executed at processor 311 for access by subsequent instructions executing at processor 311, or for writing to storage 313; or other suitable data. The data caches may speed up read or write operations by processor 311. The TLBs may speed up virtual-address translations for processor 311. In particular embodiments, processor 311 may include one or more internal registers for data, instructions, or addresses. Depending on the embodiment, processor 311 may include any suitable number of any suitable internal registers, where appropriate. Where appropriate, processor 311 may include one or more arithmetic logic units (ALUs); be a multi-core processor; include one or more processors 311; or any other suitable processor.

Storage 313 may include any form of volatile or non-volatile memory including, without limitation, magnetic media, optical media, random access memory (RAM), read-only memory (ROM), flash memory, removable media, or any other suitable local or remote memory component or components. In particular embodiments, storage 313 may include random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM, or any other suitable type of RAM or memory. Storage 313 may include one or more memory or data storage modules, where appropriate. Storage 313 may store any suitable data or information utilized by controller 300, including software embedded in a non-transitory computer readable medium, and/or encoded logic incorporated in hardware or otherwise stored (e.g., firmware). In particular embodiments, storage 313 may include main memory for storing instructions for processor 311 to execute or data for processor 311 to operate on. In particular embodiments, one or more memory management units (MMUs) may reside between processor 311 and storage 313 and facilitate accesses to storage 313 requested by processor 311.

In particular embodiments, storage 313 may include mass storage for data or instructions. As an example and not by way of limitation, storage 313 may include a hard disk drive (HDD), a floppy disk drive, flash memory, an optical disc, a magneto-optical disc, magnetic tape, or an external drive or a combination of two or more of these. Storage 313 may include removable or non-removable (or fixed) media, where appropriate. Storage 313 may include components internal or external to controller 300, where appropriate. In particular embodiments, storage 313 may include non-volatile, solid-state memory. In particular embodiments, storage 313 may include read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. Storage 313 may take any suitable physical form and may comprise any suitable number or type of storage. Storage 313 may include one or more storage control units facilitating communication between processor 311 and storage 313, where appropriate.

As an example and not by way of limitation, controller 300 may load instructions from one component of storage 313 (e.g., a hard-disk drive) or another source (such as, for example, another computer system) to another component of storage 313 (e.g., system memory). Processor 311 may then load the instructions from storage 313 to an internal register or internal cache. To execute the instructions, processor 311 may retrieve the instructions from the internal register or internal cache and decode them. During or after execution of the instructions, processor 311 may write one or more results (which may be intermediate or final results) to the internal register or internal cache. Processor 311 may then write one or more of those results to storage 313. In particular embodiments, processor 311 may execute only instructions in one or more internal registers or internal caches or in a particular portion of storage 313 and may operate only on data in one or more internal registers or internal caches or in a particular portion of storage 313.

In particular embodiments, interface 317 may include hardware, encoded software, or both providing one or more interfaces for communication between controller 300 and any components or devices used in packaging electronic devices (e.g., any components depicted in FIG. 1), any users responsible for managing the packaging of electronic devices, any networks or network devices, and/or any other computer systems. As an example and not by way of limitation, communication interface 317 may include a network interface controller (NIC) or network adapter for communicating with an Ethernet or other wire-based network and/or a wireless NIC (WNIC) or wireless adapter for communicating with a wireless network.

In some embodiments, interface 317 may include one or more interfaces for one or more I/O devices. One or more of these I/O devices may enable communication between an operator or user and controller 300. As an example and not by way of limitation, an I/O device may include a keyboard, keypad, microphone, monitor, mouse, printer, scanner, speaker, still camera, stylus, tablet, touchscreen, trackball, video camera, another suitable I/O device or a combination of two or more of these. An I/O device may include one or more sensors. For example, an I/O device may include a scanner configured to recognize a metal base pattern on a substrate of a component of an electronic device. Particular embodiments may include any suitable type and/or number of I/O devices and any suitable type and/or number of interfaces 317 for them. Where appropriate, interface 317 may include one or more drivers enabling processor 311 to drive one or more of these I/O devices.

Depending on the embodiment, interface 317 may be any type of interface suitable for any type of network. As an example, and not by way of limitation, interface 317 may be used to send and receive data in an ad-hoc network, a personal area network (PAN), a local area network (LAN), a wide area network (WAN), a metropolitan area network (MAN), or through one or more portions of the Internet or a combination of two or more of these. One or more portions of one or more of these networks may be wired or wireless. One or more portions of one or more of these networks may use standard or proprietary protocols. Interface 317 may be able to communicate with a wireless PAN (WPAN) (such as, for example, a BLUETOOTH WPAN), a Wi-Fi network, a WI-MAX network, an LTE network, an LTE-A network, a cellular telephone network (such as, for example, a Global System for Mobile Communications (GSM) network), or any other suitable wireless network or a combination of two or more of these. Controller 300 may include any suitable number of any suitable type of interface 317 for any one or more of networks and/or I/O devices, where appropriate.

Bus 312 may include any combination of hardware, software embedded in a computer readable medium, and/or encoded logic incorporated in hardware or otherwise stored (e.g., firmware) to couple the components of controller 300 to each other. As an example and not by way of limitation, bus 312 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCI-X) bus, a serial advanced technology attachment (SATA) bus, a Video Electronics Standards Association local (VLB) bus, or any other suitable bus or a combination of two or more of these. Bus 312 may include any number, type, and/or configuration of buses 312, where appropriate. In particular embodiments, one or more buses 312 (which may each include an address bus and a data bus) may couple processor 311 to storage 313. Bus 312 may include one or more memory buses.

Herein, reference to a computer-readable storage medium encompasses one or more tangible and non-transitory computer-readable storage media possessing structures. As an example, and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, a flash memory card, a flash memory drive, or any other suitable tangible computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101.

Particular embodiments may include one or more non-transitory computer-readable storage media implementing any suitable storage. In particular embodiments, a computer-readable storage medium implements one or more portions of processor 311 (such as, for example, one or more internal registers or caches), one or more portions of storage 313, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody encoded software.

Herein, reference to encoded software may encompass one or more applications, bytecode, one or more computer programs, one or more executables, one or more instructions, logic, machine code, one or more scripts, or source code, and vice versa, where appropriate, that have been stored or encoded in a computer-readable storage medium. In particular embodiments, encoded software includes one or more application programming interfaces (APIs) stored or encoded in a computer-readable storage medium. Particular embodiments may use any suitable encoded software written or otherwise expressed in any suitable programming language or combination of programming languages stored or encoded in any suitable type or number of computer-readable storage media. In particular embodiments, encoded software may be expressed as source code or object code. In particular embodiments, encoded software is expressed in a higher-level programming language, such as, for example, C, Perl, or a suitable extension thereof. In particular embodiments, encoded software is expressed in a lower-level programming language, such as assembly language (or machine code). In particular embodiments, encoded software is expressed in JAVA. In particular embodiments, encoded software is expressed in Hyper Text Markup Language (HTML), Extensible Markup Language (XML), or other suitable markup language.

The following explanation may provide additional detail as to some ways in which certain components of controller 300 may provide particular features. In particular, the components of controller 300 may work together in order to control the packaging of electronic devices (e.g., MEMs devices, FPA microbolometers, etc.), in accordance with particular embodiments. For example, interface 317 may be used to receive pattern messages from, for example, a user. The pattern messages may comprise a pattern template or otherwise be indicative of a pattern with which a solder jet is to deposit melted solder dots on a substrate of a component of an electronic device. In some embodiments, interface 317 may receive user input (e.g., dimensions) creating the pattern through controller 300.

The pattern or pattern message may then be stored in storage 313. In some embodiments, storage 313 may store several patterns. Each pattern may be associated with a different component of an electronic device and/or different electronic devices. Processor 311 may use the stored pattern to generate commands for one or more devices used in the wafer level packaging of the electronic device. For example, based on the pattern, processor 311 may generate a solder command for a solder jet. The solder command may comprise one or more instructions that the solder jet may use in determining where to deposit melted solder dots.

Storage 313 may also include a table, chart, database, or other organization of data that may specify different settings, materials or components to use for different electronic devices. For example, for each electronic device, a table (or other organization of data) may specify a pattern to use, one or more types of solder to use, a corresponding temperature to use to melt the solder, the vacuum level that the electronic device is to be packaged in, a time value that the electronic device is to be heated and/or placed within the vacuum, an amount of compressive force to apply between the two components of an electronic device, and/or any other information that may be used in packaging the electronic device. Processor 311 may use this information to generate one or more commands for the appropriate device or component. For example, the information may be used to generate a heating command specifying how hot a heating element is to get in order to re-melt the solder dots that may be deposited on the substrate of one component of an electronic device. As another example, the information stored by storage 313 may be used by processor 311 to determine and generate at least one pressure command for the vacuum chamber. This may allow for different vacuum levels to be used with different electronic devices.

In some embodiments, interface 317 may receive information from one or more sensors. This sensor input may comprise feedback or other information that processor 311 may use in generating commands. For example, a sensor input related to the relative positions of the two components of an electronic device may be used to generate alignment commands for an alignment device configured to align the components. The sensor input may also include a sensor configured to recognize a pattern on a substrate. Processor 311 may use the information to generate commands for a solder jet to follow the pattern. The sensor input may also include temperature and vacuum readings which processor 311 may use in generating temperature or vacuum commands to adjust the temperature or vacuum, where appropriate. Other sensors may be used for generating other commands.

Thus far, several different embodiments and features have been presented. Particular embodiments may combine one or more of these features depending on operational needs and/or component limitations. This may allow for great adaptability of controller 300 to the needs of various organizations and users. Some embodiments may include additional features.

Figure 4:
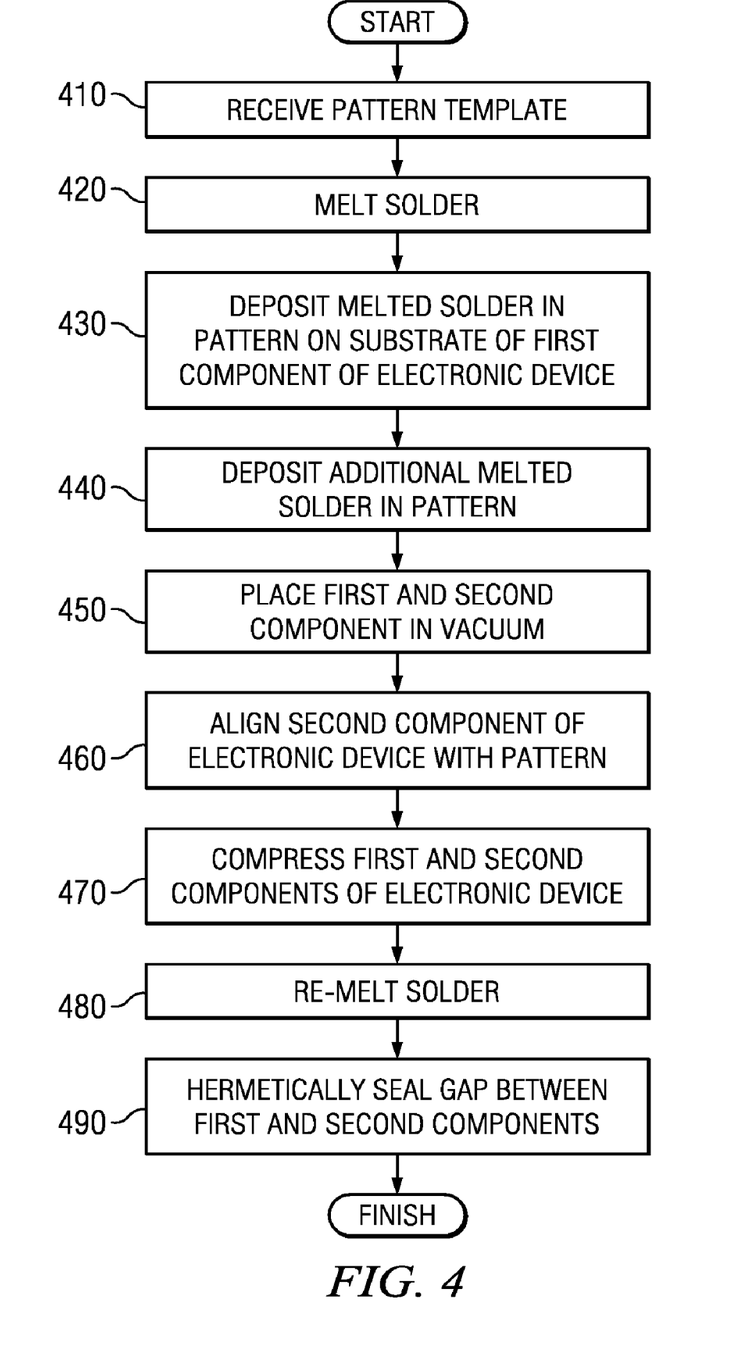
FIG. 4 depicts a method for packaging an electronic device, in accordance with particular embodiments.

FIG. 4 depicts a method for packaging an electronic device, in accordance with particular embodiments. The method begins at step 410 where a pattern template is received. The pattern template may include at least one pattern that forms a closed loop. The closed loop may be associated with a hermetic seal that is used in vacuum sealing at least a portion of an electronic device. The pattern template may include dimensions and other information needed to deposit melted solder dots in a pattern on a substrate of a first component of an electronic device. The dimensions may include three dimensions, a length, a width, and a height for each portion of the pattern. In some embodiments, the pattern may also include information about the type of solder to use for particular portions of the pattern. The pattern template received at step 410 may be one of many pattern templates received. Each pattern template may be associated with a different electronic device, and may comprise a different associated pattern. In some embodiments, the template may comprise the same pattern repeated multiple times. Each pattern may correspond to a different electronic device. This may be used where a single substrate is used to make several copies of the same component for several copies of the same electronic device.

At step 420, solder is melted. The solder may be melted prior to being jetted on the component substrate. Melting the solder may comprise bringing the solder to a liquid state such that a jet nozzle of a solder jet is able to deposit the solder on a component substrate. The solder may be melted by the solder jet used to deposit the solder on the component substrate, by a hopper associated with the solder jet and used to store the solder, and/or by a heating element functionally located before the hopper or between the hopper and the solder jet. The type of solder used may vary depending on operational needs, pattern specifications, and/or the desired performance characteristics for the electronic device. For example, in some embodiments, the solder may comprise a mixture of 80% gold and 20% tin, or any other fluxless solder.

At step 430, the melted solder is deposited in a pattern on a substrate of a first component of an electronic device. The melted solder may be deposited as a plurality of individual melted solder dots. In some embodiments, the solder may be deposited with gaps between all or some of the deposited solder dots. The solder dots may cool and re-solidify upon being deposited on the component substrate. In some embodiments melted solder dots may be deposited upon one another to increase the thickness or height of deposited melted solder dots. Because the solder is deposited as dots, there may exist many small gaps between the individual dots. These gaps may provide a passage for changing pressure to escape without causing blow-outs. The melted solder dots may be deposited on a metal pattern that is formed in the substrate of the first component of the electronic device. A corresponding metal pattern may be formed in the substrate of a second component of the electronic device. The metal pattern or patterns may be used as a base to which the solder may adhere when it is re-melted. In some embodiments, the melted solder may be deposited on both the first and the second components of the electronic device.

At step 440, additional melted solder is deposited in the pattern. For example, if the component substrate has multiple electronic devices thereon, additional melted solder may be deposited in columns at various points of the substrate. The columns may be separated from any of the electronic devices that are to be hermetically sealed. The additional solder deposited in the pattern may be used to increase the height of the melted solder dots deposited on the component substrate. In some embodiments, the additional height may be used to create a vacuum conductance gap between the two components of the electronic device. In some embodiments, the increased height may improve vacuum conductance during wafer level packaging. The vacuum conductance gap may form a path through which changes in pressure may be channeled. This may allow for a higher vacuum to be created in the hermetically sealed portion of the electronic device. In some embodiments, the additional solder used to create the conductance gap may be separate from the solder used to form one or more of the hermetic seals. In certain embodiments the additional solder may be deposited higher than the solder deposited for the seal. In certain embodiments, the columns may comprise a different type of solder than the solder used for the hermetic seal.

At step 450 the first and second components of the electronic device are placed in a vacuum chamber. The vacuum chamber may be able create a high vacuum environment in which the two components are sealed together. For example, the vacuum chamber may create a vacuum of between ambient pressure and $10^{-9}$ torrs.

At step 460 the second component of the electronic device is aligned with the pattern of jetted solder on the first component of the electronic device. In some embodiments, the substrate of the second component may have a metal pattern, similar to the pattern of deposited solder dots on the first component. This metal pattern may be aligned with the pattern of solder dots to provide a material with which the solder can bond to when the solder is re-melted. In some embodiments, the first and second components may be part of two wafers. In such an embodiments, step 460 may comprise aligning the wafers such that each pattern of deposited solder dots deposited on the first wafer is aligned with a corresponding metal pattern on the second wafer. In some embodiments, the second component may be aligned with the first component within a vacuum chamber. In some embodiments, the two components may be aligned prior to being placed in the vacuum chamber.

At step 470, the first and second components of the electronic device are compressed. In some embodiments, the compression may be applied by gravity due to the weight of the upper component. In some embodiments, the compression may be applied by a device, such as alignment device 110, configured to apply pressure to one or both of the components of the electronic device.

At step 480, the solder is re-melted. As the solder dots begin to melt the solder may begin to spread out. In some instances the solder may tend to spread along the metal base patterns in the substrates of the two components of the electronic device. As the solder spreads, the height of the solder may shrink causing the gap between the two components to decrease. This may decrease the volume of space between the two components. In a typical packaging scenario that does not use solder dots, the change in pressure due to the change in volume has an increased chance of creating blow-outs. However, the gaps between the solder of dots deposited at step 430 provide channels with which the change in pressure is able to escape. This may decrease the chances of a blow-out.

The solder may continue to melt until it is completely melted. The melted solder may then cool and form a hermetic seal between the first component and the second component as shown at step 490. Because the only solder used in making the hermetic seal is the solder that was deposited by the solder jet, the hermetic seal at step 490 may be formed without requiring any lithography or other processing steps to remove excess materials or masking materials. This may decrease the manufacturing costs (both in the cost of materials and in the time necessary to manufacture the electronic device) associated with the electronic device. In some embodiments, the electronic device being hermetically sealed may be an infrared detector comprising a plurality of microbolometers.

Some of the steps illustrated in FIG. 4 may be combined, modified or deleted where appropriate, and additional steps may also be added to the flowchart. Additionally, steps may be performed in any suitable order without departing from the scope of particular embodiments. The steps depicted in FIG. 4 are just an example of the steps performed for a particular embodiment, other embodiments may use different steps arranged in a different order. For example, in some embodiments, the solder may be deposited on the substrate of the first component by following the pattern of the base metal in the substrate. In such an embodiment, step 410 may be modified because the pattern template may be received via the pattern in the substrate. As another example, in some embodiments the two components of the electronic device may be aligned before being placed in the vacuum chamber. This may result in switching the order of steps 450 and 460.

Although particular embodiments have been described in detail, it should be understood that various other changes, substitutions, combinations and alterations may be made hereto without departing from the spirit and scope of the disclosure or the appended claims. It is intended that particular embodiments encompass all such changes, substitutions, variations, alterations and modifications as falling within the spirit and scope of the appended claims. For example, although an embodiment has been described with reference to a number of elements included in a system configured to produce wafer level packaged electronic devices, these elements may be combined, rearranged or positioned in order to accommodate particular production needs. In addition, any of the elements described herein with respect to any figure may be provided as integrated internal or separate external components to each other where appropriate. Particular embodiments contemplate great flexibility in the arrangement of these elements as well as their internal components.

What is claimed is:

1. A method for wafer level packaging of electronic devices, comprising:
   melting solder for a solder jet;
   depositing the melted solder from the solder jet in a pattern on a substrate of a first component of a wafer level package electronic device, the pattern comprising a plurality of individual dots of melted solder;
   depositing additional melted solder from the solder jet to form columns of solder dots at three or more points on the substrate of the first component for providing a vacuum conductance gap between the first component of the electronic device and the second component of the electronic device;
   aligning a second component of the electronic device with the pattern deposited on the first component of the electronic device such that the second component is elevated from the first component and a portion of the pattern by the columns of solder formed with the additional melted solder;
   re-melting the solder deposited in the pattern and in the columns on the first component of the electronic device; and
   while the solder is re-melting, compressing the first component of the electronic device and the second component of the electronic device wherein reflow of the solder deposited in the columns and in the pattern and bonding of the first and second components occur simultaneously to join the second component to the portion of the pattern.

2. The method of claim 1, further comprising placing the first component of the electronic device and the second component of the electronic device in a vacuum.

3. The method of claim 1, wherein depositing the. melted solder from the solder jet in a pattern on a substrate of a first component of an electronic device, comprises depositing the melted solder from the solder jet onto a metal pattern formed in the substrate of the first component of the electronic device.

4. The method of claim 1, wherein depositing the melted solder from the solder jet in the pattern on the substrate of a first component of an electronic device comprises, depositing the melted solder from the solder jet in a pattern comprising a plurality of gaps between at least a portion of the plurality of individual dots of melted solder.

5. The method of claim 1, further comprising hermetically sealing a gap between the first component of the electronic device and the second component of the electronic device.

6. The method of claim 1, wherein the electronic device comprises an infrared-detector.

* * * * *